United States Patent
Dordet et al.

(10) Patent No.: US 8,624,586 B2
(45) Date of Patent: Jan. 7, 2014

(54) HALL EFFECT MEASURING DEVICE

(75) Inventors: Yves Dordet, Fonsorbes (FR); Eric Servel, Roques sur Garonne (FR); Marc Vandeginste, Seysses (FR)

(73) Assignee: Continental Automotive France, Toulouse (FR)

( * ) Notice: Subject to any disclaimer, the term of this patent is extended or adjusted under 35 U.S.C. 154(b) by 233 days.

(21) Appl. No.: 13/122,278

(22) PCT Filed: Aug. 21, 2009

(86) PCT No.: PCT/EP2009/006075
§ 371 (c)(1),
(2), (4) Date: Jun. 8, 2011

(87) PCT Pub. No.: WO2010/040429
PCT Pub. Date: Apr. 15, 2010

(65) Prior Publication Data
US 2011/0227568 A1    Sep. 22, 2011

(30) Foreign Application Priority Data
Oct. 10, 2008 (FR) .................................. 08 05605

(51) Int. Cl.
*G01B 7/30* (2006.01)
*G01R 33/06* (2006.01)
(52) U.S. Cl.
USPC ........................ 324/207.2; 324/251
(58) Field of Classification Search
USPC .............................. 324/207.2, 251
See application file for complete search history.

(56) References Cited

U.S. PATENT DOCUMENTS

| | | | |
|---|---|---|---|
| 4,481,469 A | 11/1984 | Hauler et al. |
| 5,210,489 A | 5/1993 | Petersen |
| 5,250,925 A | 10/1993 | Shinkle |
| 5,321,355 A | 6/1994 | Luetzow |
| 5,814,985 A | 9/1998 | Oudet |

FOREIGN PATENT DOCUMENTS

| | | |
|---|---|---|
| EP | 0 273 129 A2 | 7/1988 |
| FR | 2 512 208 A3 | 3/1983 |
| FR | 2 648 914 A1 | 12/1990 |
| FR | 2 797 959 A1 | 3/2001 |
| JP | 2005/017058 A | 1/2005 |
| WO | 87/06348 A1 | 10/1987 |
| WO | 01/55668 A1 | 8/2001 |

OTHER PUBLICATIONS

International Search Report, dated Mar. 19, 2010, from corresponding PCT application, PCT/EP2009/006075.

*Primary Examiner* — Reena Aurora
(74) *Attorney, Agent, or Firm* — Young & Thompson (57) ABSTRACT

A Hall effect measuring device under the hood of a motor vehicle includes a housing, a Hall effect sensor including a holed magnet and a chip arranged at the Gaussian zero point of the magnet, and a ferromagnetic target including a measurement surface in which the chip is securely attached to the magnet, and defines a measurement plane. The sensor and the ferromagnetic target are arranged to be imparted with a relative motion with respect to one another, the sensor being positioned in the housing and configured to measure the value of the magnetic field of the magnet, vertically in line with the chip, on a measurement axis perpendicular to the measurement plane based on relative translational motion and on relative rotational motion.

20 Claims, 4 Drawing Sheets

HALL EFFECT MEASURING DEVICE

The present invention relates to a Hall effect measuring device.

More specifically, the invention relates to a Hall effect measuring device under the hood of a motor vehicle, the device comprising:
- a housing,
- a Hall effect sensor, and
- a ferromagnetic target.

In this device:
- the sensor typically comprises a holed magnet and an electronic chip, hereinafter called "chip". The chip is securely attached to the magnet, and positioned at the Gaussian zero point of said magnet. The magnet—generally of roughly cylindrical shape—is holed with a cylindrical and concentric hole,
- the ferromagnetic target includes a measurement surface,
- the chip is securely attached to the magnet, that is to say that any motions of the chip are integral with those of the magnet, and defines a measurement plane,
- the Hall effect sensor and the ferromagnetic target are able to be imparted with a relative motion with respect to one another, and
- the sensor is positioned in said housing and configured to measure the value of the magnetic field of the magnet, vertically in line with the chip, on a measurement axis perpendicular to the measurement plane.

Such a device is known to those skilled in the art. However, according to the prior art, such a device is limited in its application to rotational frequency or speed measurements, in particular by switching Hall effect sensors, called "switches", in which the target is circular and comprises a plurality of teeth; this makes it possible essentially to obtain an incremental sensor.

The aim of the present invention is to propose an alternative to such devices.

With this objective in view, the device according to the invention, also conforming to the preamble given above, is noteworthy in that:
- the Hall effect sensor (1) is linear,
- the device comprises a reference position corresponding to a given relative position of the chip (20) and of the target (50),
- the relative motion is with two degrees of freedom, each of which respectively corresponds to a translational motion or to a rotational motion,
- the device is configured to detect a deviation from the reference position,
- the shape and/or the dimension of the target (50) according to a relative motion is different respectively from the shape and/or the dimension of the target (50) according to the other relative motion.

In one embodiment, the device according to the invention also comprises means for measuring the deviation from the reference position, according to said relative motion, by measuring the measurement distance (d).

By virtue of this configuration, the device according to the invention can be applied for a position measurement, complementing the detection of the deviation from the reference position.

To this end, the device is configured to measure the relative position of the ferromagnetic target and of the sensor. In the case in point, the device according to the invention includes means for deducing, from the measurement distance, the relative position of the ferromagnetic target and of the sensor.

Preferably, at least the shape and the orientation of the measurement surface of the ferromagnetic target are dependent on the type of relative motion, for the measurement distance (d) to vary during said relative motion under the action of displacement means acting for this purpose on the relative positions of the chip and of the measurement surface.

In one embodiment, the relative deviation between the sensor and the target along the measurement axis is constant. This means that the deviation between the measurement plane and the rotation axis or the translation plane is constant when the relative motion is a rotational or translational motion respectively.

Preferably, the relative translational motion is performed in a plane parallel to the measurement plane.

In one embodiment, the measurement surface of the ferromagnetic target is planar and not parallel to the measurement plane.

Preferably, the relative rotational motion is performed about a rotation axis parallel to the measurement plane, and running vertical to the chip.

Preferably, the output signal of the sensor is proportional to the trend of the magnetic field of the magnet.

According to another of its subjects, the invention relates to a gearbox including the device according to the invention.

By virtue of the invention, it is possible, for example, to determine the position of a fixed target on the gear selection axis and determine whether the gearbox control is at the "neutral point", the neutral point, in the case in point, constituting said reference position.

The sensor according to the invention gives position information concerning the gear lever and/or the gear selector depending on whether it is placed on the lever or on the gearbox.

The advantage of the device according to the invention is that it can be adapted very easily to different gearboxes: it is sufficient to adapt the target to the motion and to the desired information; the sensor remains the same.

Thus, by virtue of the invention, the measurement surface of the ferromagnetic target can be configured for the measurement distance to be variable according to the relative motion, in particular when the relative deviation between the sensor and the target on the measurement axis is constant.

Other features and advantages of the present invention will become more clearly apparent upon reading the following description given as an illustrative and nonlimiting example, and in light of the appended figures in which.

Figure 1:
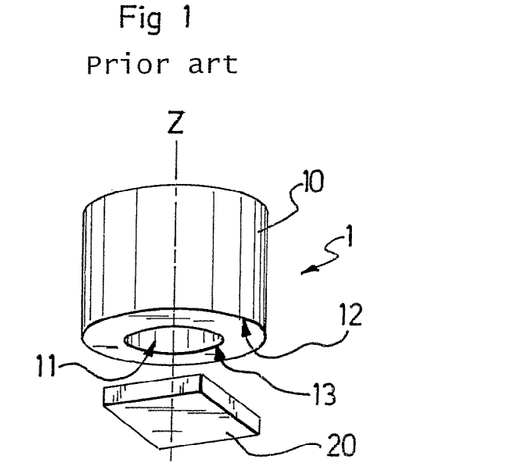
FIG. 1 illustrates a Hall effect sensor according to the prior art.
Figure 2A:
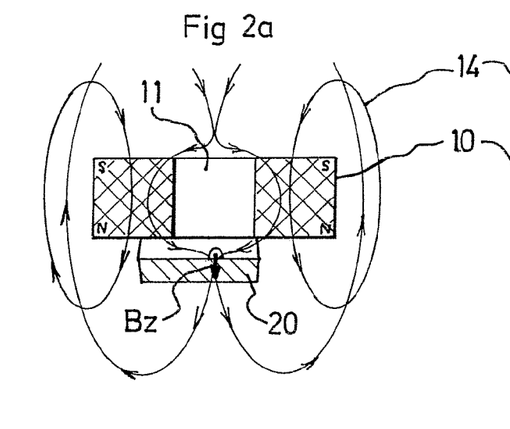
FIG. 2A illustrates the operating principle of a Hall effect measuring device in the absence of a ferromagnetic target.
Figure 2B:
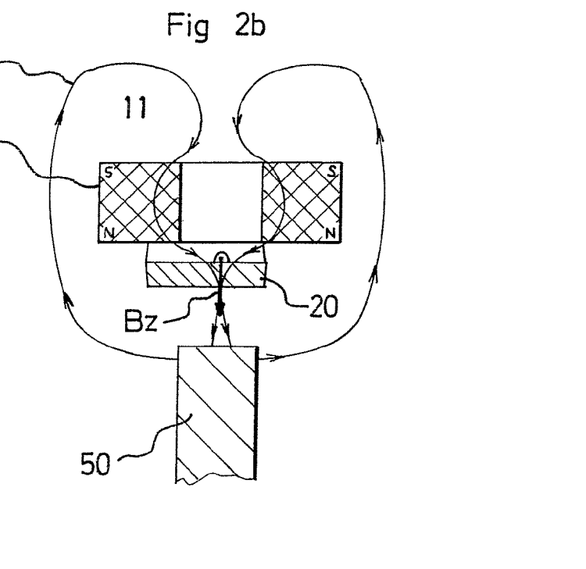
FIG. 2B illustrates the operating principle of a Hall effect measuring device in the presence of a ferromagnetic target.

A conventional Hall effect sensor 1 applied in the invention is illustrated in FIG. 1. It comprises, positioned in a housing 30 (not represented), a magnet 10 and a chip 20 securely attached to the magnet and configured to measure the magnetic field of the magnet 10, in the case in point its vertical component Bz, as illustrated in FIG. 2A and FIG. 2B in which the magnet 20 is configured by way of example with the south face S on top and the north face N on the bottom.

The magnet 10 is holed. Preferably, the hole 11 of the magnet is circular and the magnet has a disk-shaped cross section.

In the embodiment illustrated, the magnet has symmetry of revolution about an axis Z (vertical for example), so that the hole and the magnet are circular and concentric.

The chip is preferably positioned on the side of the hole 11, the hole 11 representing the sensitive area of the sensor 1.

For the devices according to the invention, there is a point called Gaussian zero point of the magnet, at which all the components (Bx, By, Bz) of the magnetic field of the magnet are zero.

The advantage of the Gaussian zero point is that it is relatively stable over time and relatively independent of temperature, whereas the use of a full magnet leads to an offset in the measured magnetic field that then has to be compensated for. Furthermore, this offset is greatly affected by temperature.

According to the invention, the chip 20 is advantageously positioned at the Gaussian zero point of the magnet 10. The stability of the Gaussian zero point is essential to the position measurement by a linear Hall effect sensor, which characteristic is much more negligible in the "switch" type Hall effect sensors for which the accurate measurement of the distance is not necessary (usually, such types of sensors are used in binary mode and make it possible to state whether a target is facing or not facing the sensor).

For the deviation detection or the position measurement, there is usually a ferromagnetic piece 50, called target, facing the housing 30. In operation, the target 50 and the housing 30 are moved by a relative motion, and the sensor 1 is configured to measure the amplitude of this motion, that is to say, the relative position of the surface of the target and of the sensor.

FIG. 2A illustrates the operating principle of a Hall effect measurement device before (or after) the passage of a ferromagnetic target in front of the sensor 1.

FIG. 2B illustrates the operating principle of a Hall effect measuring device during the passage of a ferromagnetic target 50 in front of the sensor 1.

Comparing these two figures, the field lines 14 of the magnet are clearly deflected by the presence of the target 50. The component Bz of the magnetic field of the magnet 10 is modified thereby, measured by the chip 20, and an output signal representative of this measurement is emitted by the sensor (see FIG. 5).

According to the invention, such a measuring device makes it possible to determine a position, and is advantageously implemented in motor vehicle gearboxes.

For example, the sensor 1 can be positioned either at the level of the gear lever, or directly at the level of the gearbox, for example in order to determine the position of the gear selector. The placement of the target 50 depends on that of the sensor and the placement of the target and of the corresponding sensor in a gearbox depends on the type of gearbox.

In the case in point, according to the invention, the gearbox and the gear selector may be means for varying the measurement distance d during a relative motion.

Now, depending on the type of gearbox, in particular whether it is a manual or automatic gearbox, the mechanical link between the gear lever and the gear selector may be complex.

Typically, the gear lever is linked to the gearbox by a system of linkages such that the motions of the latter lead to a translational and/or rotational motion of a gear ratio selection axis.

For certain manual gearboxes, the clearances and tolerances of the linkage system may lead to the sensor preferably being positioned on the gear selection axis or on the gear lever depending on the desired accuracy.

For an automatic gearbox, typically, the gear lever is displaced linearly. The invention makes it possible to know the position of the gear lever, so that this position information can, for example, be given to the gearbox control system.

However, regardless of the type of gearbox, a noteworthy position is the one called "neutral point" corresponding to a position that is usually substantially central. The invention is advantageously implemented for the detection of this neutral point position or for the measurement of the position relative to the neutral point, in particular for the following reasons.

The invention is advantageously implemented for motor vehicles equipped with a so-called "stop & start" system by virtue of which the engine is stopped automatically during a temporary stoppage of the vehicle and restarts automatically when the driver presses on the accelerator pedal (torque demand).

To this end, it is necessary to determine the position of the gear selector. In practice, since the engine restarts automatically, it is necessary for the clutch pedal to be depressed and/or for the gear lever to be at the neutral point, otherwise the vehicle risks "jumping" forward or backward. The computer of the vehicle must therefore be informed of the position of the gear selector, which is possible by virtue of the invention.

According to the invention, the shape of the measurement surface 51 of the ferromagnetic target 50 is adapted to the type of relative motion.

Figure 5:
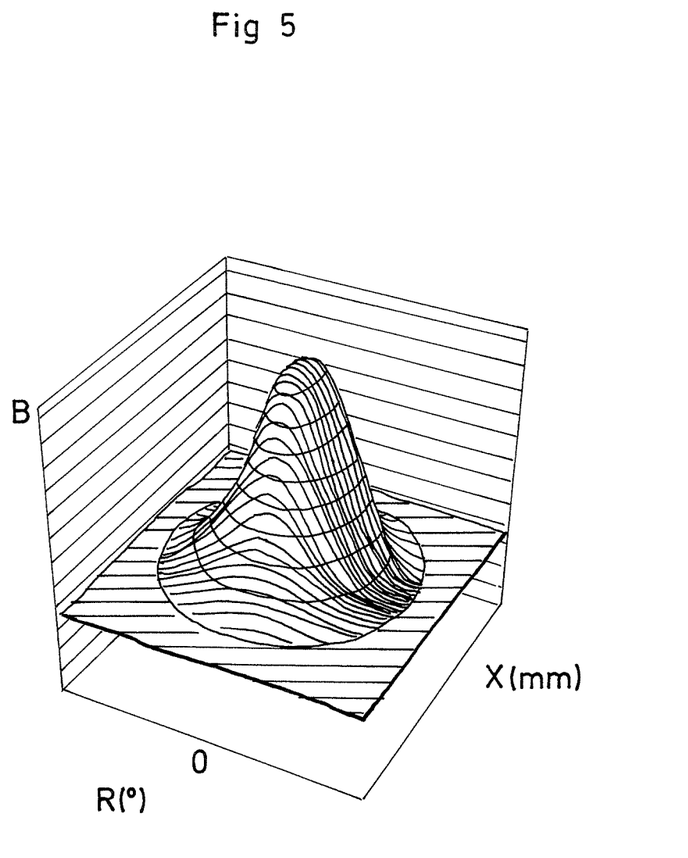
FIG. 5 illustrates a measurement of the field variation of the magnet according to a relative motion corresponding to a rotation and a translation.

FIG. 5 illustrates the field variation B of the magnet according to a rotation angle R(°) and a longitudinal displacement X (mm).

The intensity of the field B depends on the value of the measurement distance d, which is the distance between the chip 20 and the measurement surface 51 of the target, along the measurement axis Z vertically in line with the chip.

This FIG. 5 corresponds to an embodiment in which the reference position corresponds to the neutral point of a gearbox, for which the field B is maximum (chip 20 and target 50 aligned on the measurement axis Z).

In this embodiment, the Hall effect sensor 1 and the ferromagnetic target 50 are able to be imparted with a relative motion with two degrees of freedom, one relative to the other, in which one corresponds to a translational motion and the other corresponds to a rotational motion.

In this embodiment, the target 50 has an asymmetrical shape, in the case in point a rectangular shape of dimensions 5×3 mm. It is thus possible to obtain a different response according to one degree of freedom or the other, in the case in point a relative translational or rotational motion.

When the value of the field B is no longer maximum, it can be concluded therefrom that the gearbox is no longer at the neutral point and, for example, a signal to this effect can be emitted.

It is thus possible to detect a deviation from the "neutral point" reference position.

Furthermore, in another embodiment, the device according to the invention may include means for not only detecting but measuring the deviation from the reference position.

To this end, the values of the magnetic field B of the magnet according to the relative motion can be recorded in a memory. For example, FIG. 5 may illustrate a map. The instantaneous value of the magnetic field B depending for a given relative motion on the measurement distance d, it is possible to deduce therefrom the relative deviation between the chip 20 and the target 50.

Figures 3A, 3B, 3C:
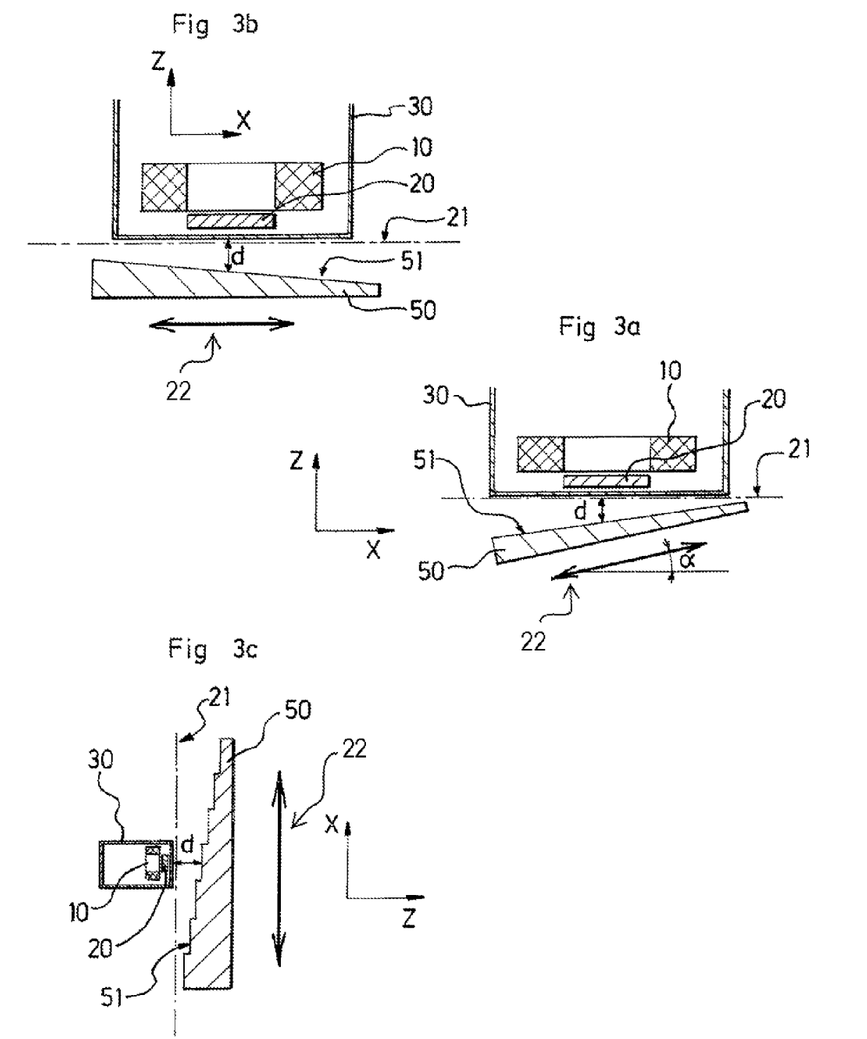
FIG. 3A illustrates an embodiment of the device according to the invention in which the relative motion is a translational motion offset relative to the measurement plane.
FIG. 3B illustrates an embodiment of the device according to the invention in which the relative motion is a translational motion parallel to the measurement plane.
FIG. 3C illustrates another embodiment of the device according to the invention in which the relative motion is a translational motion parallel to the measurement plane.

For example, FIGS. 3A, 3B and 3C each illustrate an embodiment of the device according to the invention in which the relative motion between the Hall effect sensor 1 and the ferromagnetic target 50 is a translational motion illustrated by a double arrow, on a translation plane 22.

In one embodiment, FIG. 3A, the translational motion is offset by an angle α relative to the axis X, or relative to the measurement plane 21.

In another embodiment, FIGS. 3B and 3C, the translational motion is parallel to the axis X, that is to say to the measurement plane 21, so the relative deviation between the sensor 1 and the target 50 on the measurement axis Z is constant.

The expression "constant relative deviation between the sensor 1 and the target 50" should be understood, for example, to mean that the relative deviation between the respective centers of gravity on the measurement axis Z is constant.

Thus, for a relative rotational motion, the deviation on the axis Z between the sensor (the measurement plane 21) and the rotation axis R is constant.

For a relative translational motion, this translation is performed preferably in a translation plane 22 parallel to the measurement plane 21 (FIGS. 3B, 3C). The deviation on the axis Z between the sensor (the measurement plane 21) and the translation plane 22 is therefore constant. When the translation is performed in a translation plane 22 secant to the measurement plane 21 (FIG. 3A), the shift due to the angle α must be compensated.

The measurement surface 51 of the ferromagnetic target 50 may have a planar surface (FIGS. 3A, 3B, 4A) or not (FIGS. 3C, 4B), in the case in point, a graduated surface.

According to the invention, during a continuous displacement of the ferromagnetic target 50 in front of the sensor 1, the trend of the measurement distance d is an exclusively increasing or zero function (respectively decreasing or zero depending on the direction of displacement).

As illustrated in FIG. 3B and FIG. 3C, the ferro-magnetic target 50 may be of substantially triangular shape in cross section. It may also be of parallelepipedal shape and inclined relative to the sensor, or of any other shape, as long as the measurement surface 51 is not continually parallel to the measurement plane 21 during the relative motion.

Figure 4A:
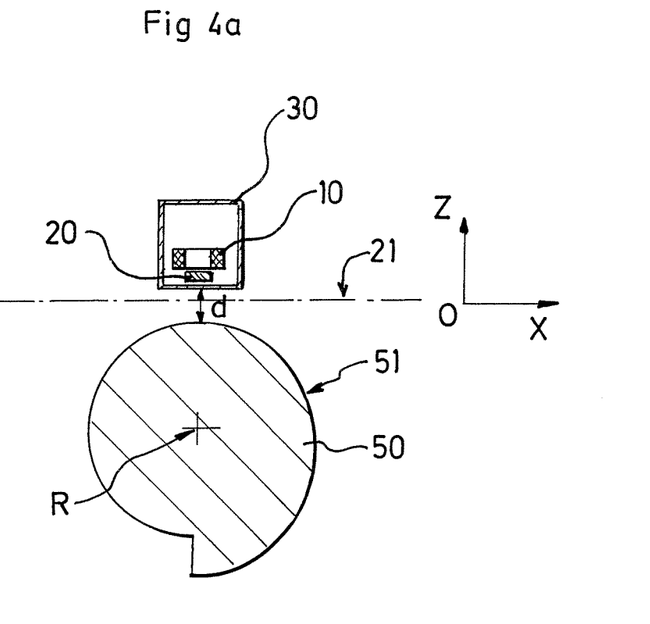
FIG. 4A illustrates an embodiment of the device according to the invention in which the relative motion is a rotational motion on an axis parallel to the measurement plane.
Figure 4B:
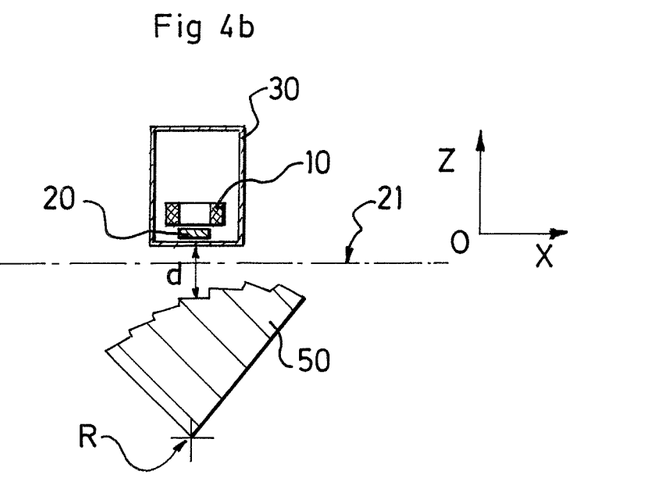
FIG. 4B illustrates another embodiment of the device according to the invention in which the relative motion is a rotational motion on an axis parallel to the measurement plane.

FIG. 4A and FIG. 4B each illustrate one embodiment of the device according to the invention in which the type of relative motion between the Hall effect sensor and the ferromagnetic target 50 is a rotational motion, in the case in point, about the rotation axis R, perpendicular to the plane XOZ.

In a manner similar to the embodiment relating to a relative translational motion, for a relative rotational motion (FIG. 4A, FIG. 4B), the measurement surface 51 may be progressive, that is to say, snail-shaped (FIG. 4A), or stepped (FIG. 4B).

In the case in point, the invention cannot implement ferromagnetic targets 50 that have a measurement surface 51 with cyclical shape, typically toothed wheels. On the other hand, as illustrated in FIG. 3C or 4B, the measurement surface 51 of the ferromagnetic target 50 is stepped, with each step in the case in point being parallel to the measurement plane 21 during the measurement and at a respective measurement distance d that is different from one step to another.

For the stepped shapes (FIGS. 3C, 4B), the device according to the invention is advantageously configured for each step or level to correspond to a respective specific position of the gear selector or lever.

To determine the relative position of the ferromagnetic target 50 and of the sensor 1, the device according to the invention advantageously includes means for deducing said relative position, in the case in point in the form of a mapping table between the value of the magnetic field B measured by the sensor and a respective specific position of the gear selector or lever.

The position information is then sent by communication means, for example, to the vehicle computer.

The invention claimed is:

1. A Hall effect measuring device under the hood of a motor vehicle, the device comprising:
   a housing (30),
   a Hall effect sensor (1) comprising a holed magnet (10) and a chip (20) arranged at the Gaussian zero point of said magnet (10),
   a ferromagnetic target (50) comprising a measurement surface (51), and
   a reference position corresponding to a given relative position of the chip (20) and of the target (50), wherein,
   the chip (20) is securely attached to the magnet (10), and defines a measurement plane (21),
   the Hall effect sensor (1) and the ferromagnetic target (50) are movable with respect to each other and are able to be imparted with a relative motion with respect to one another,
   the sensor (1) is positioned in said housing (30) and configured to measure the value of the magnetic field (B) of the magnet (10), vertically in line with the chip (20), on a measurement axis (Z) perpendicular to the measurement plane (21),
   the Hall effect sensor (1) is linear,
   the relative motion between the Hall effect sensor (1) and the ferromagnetic target (50) is with two degrees of freedom, a first degree of freedom corresponding to a translational motion and a second degree of freedom corresponding to a rotational motion,
   the device is configured to detect a deviation from the reference position,
   at least one of the shape and the dimension of the target (50) according to a first relative translational motion is different respectively from the at least one of the shape and the dimension of the target (50) according to a second relative rotational motion.

2. The device as claimed in claim 1, also comprising means for measuring the deviation from the reference position.

3. The device as claimed in claim 2, in which at least the shape and an orientation of the measurement surface (51) of the ferromagnetic target (50) are dependent on the type of relative motion, for the measurement distance (d) to vary during said relative motion under the action of displacement means acting for this purpose on the relative positions of the chip (20) and of the measurement surface (51).

4. The device as claimed in claim 2, in which the relative deviation between the sensor (1) and a target (50) along the measurement axis (Z) is constant.

5. The device as claimed in claim 2, in which the output signal of the sensor (1) is proportional to a trend of the magnetic field of the magnet (10) detected.

6. The device as claimed in claim 1, in which at least the shape and an orientation of the measurement surface (51) of the ferromagnetic target (50) are dependent on the type of relative motion, for the measurement distance (d) to vary during said relative motion under the action of displacement means acting for this purpose on the relative positions of the chip (20) and of the measurement surface (51).

7. The device as claimed in claim 1, in which the relative deviation between the sensor (1) and the target (50) along the measurement axis (Z) is constant.

8. The device as claimed in claim 1, in which the output signal of the sensor (1) is proportional to a trend of the magnetic field of the magnet (10) detected.

9. A gearbox including a device as claimed in claim 1.

10. The device of claim 1, wherein,
the measurement surface (51) of the target (50) and an opposite surface of the housing (30) defines a spaced-apart measurement distance (d) between the measurement surface (51) of the target (50) and an opposite surface of the housing (30) varies with the translational motion and with the rotational motion, and
the shape of the target with respect to given relative position of the chip (20) and of the target (50) is different for i) the translational motion between the sensor (1) and the target (50) and ii) the rotational motion between the sensor (1) and the target (50) such that the measurement distance (d) varies differently for i) the translational motion between the sensor (1) and the target (50) and ii) the rotational motion between the sensor (1) and the target (50).

11. The device of claim 1, wherein,
the measurement surface (51) of the target (50) and an opposite surface of the housing (30) defines a spaced-apart measurement distance (d) between the measurement surface (51) of the target (50) and an opposite surface of the housing (30) varies with the translational motion and with the rotational motion, and
the dimension of the target with respect to given relative position of the chip (20) and of the target (50) is different for i) the translational motion between the sensor (1) and the target (50) and ii) the rotational motion between the sensor (1) and the target (50) such that the measurement distance (d) varies differently for i) the translational motion between the sensor (1) and the target (50) and ii) the rotational motion between the sensor (1) and the target (50).

12. The device of claim 1, wherein,
the measurement surface (51) of the target (50) varies such that i) a measurement distance (d) between the chip (20) and the measurement surface (51) of the target increases with relative displacement of the chip (20) and of the target (50) in a first translational direction and ii) the measurement distance (d) between the chip (20) and the measurement surface (51) of the target decreases with relative displacement of the chip (20) and of the target (50) in an opposite second, translational direction.

13. The device of claim 1, wherein,
the measurement surface (51) of the target (50) varies such that i) a measurement distance (d) between the chip (20) and the measurement surface (51) of the target linearly increases with relative displacement of the chip (20) and of the target (50) in a first translational direction and ii) the measurement distance (d) between the chip (20) and the measurement surface (51) of the target linearly decreases with relative displacement of the chip (20) and of the target (50) in an opposite second, translational direction.

14. The device of claim 1, wherein,
the measurement surface (51) of the target (50) varies such that i) a measurement distance (d) between the chip (20) and the measurement surface (51) of the target step-wise increases with relative displacement of the chip (20) and of the target (50) in a first translational direction and ii) the measurement distance (d) between the chip (20) and the measurement surface (51) of the target step-wise decreases with relative displacement of the chip (20) and of the target (50) in an opposite second, translational direction.

15. A Hall effect measuring device under the hood of a motor vehicle, the device comprising:
a housing (30);
a linear Hall effect sensor (1) positioned in said housing (30),
the sensor (1) comprising i) a holed magnet (10), a hole (11) of the magnet being a sensitive area of the sensor (1), and ii) a chip (20) attached to said magnet (10) at a side of the hole (11) and arranged at a Gaussian zero point of said magnet (10),
the chip defining a measurement plane (21), and
the sensor (1) being configured to measure a value of a magnetic field (B) of the magnet (10), vertically in line with the chip (20), on a measurement axis (Z) perpendicular to the measurement plane (21);
a ferromagnetic target (50) comprising a measurement surface (51) facing an opposite surface of the housing (30), the target (50) and the sensor (1) being movable with respect to each other by a relative motion such that a measurement distance (d) between the measurement surface (51) of the target (50) and the opposite surface of the housing (30) varies with the relative motion; and
a reference position corresponding to a given relative position of the chip (20) and of the target (50), wherein,
the relative motion between the sensor (1) and the target (50) is with first and second degrees of freedom, the first degree of freedom corresponding to a translational motion and the second degree of freedom corresponding to a rotational motion,
the device is configured to detect a deviation from the reference position, based on one of a shape and a dimension of the target, a value of the measurement distance (d) varying in i) a first response pattern according to the translational motion between the sensor (1) and the target (50), and ii) a second response pattern according to the rotational motion between the sensor (1) and the target (50).

16. The device of claim 15, wherein the shape of the target with respect to given relative position of the chip (20) and of the target (50) is different for i) the translational motion between the sensor (1) and the target (50) and ii) the rotational motion between the sensor (1) and the target (50) such that the measurement distance (d) varies differently for i) the translational motion between the sensor (1) and the target (50) and ii) the rotational motion between the sensor (1) and the target (50).

17. The device of claim 15, wherein the dimension of the target with respect to given relative position of the chip (20)

and of the target (50) is different for i) the translational motion between the sensor (1) and the target (50) and ii) the rotational motion between the sensor (1) and the target (50).

18. The device of claim 15, wherein,
the measurement surface (51) of the target (50) varies such that i) the measurement distance (d) increases with relative displacement of the chip (20) and of the target (50) in a first translational direction and ii) the measurement distance (d) decreases with relative displacement of the chip (20) and of the target (50) in an opposite second, translational direction.

19. The device of claim 15, wherein,
the measurement surface (51) of the target (50) varies such that i) the measurement distance (d) linearly increases with relative displacement of the chip (20) and of the target (50) in a first translational direction and ii) the measurement distance (d) linearly decreases with relative displacement of the chip (20) and of the target (50) in an opposite second, translational direction.

20. The device of claim 15, wherein,
the measurement surface (51) of the target (50) varies such that i) the measurement distance (d) step-wise increases with relative displacement of the chip (20) and of the target (50) in a first translational direction and ii) the measurement distance (d) step-wise decreases with relative displacement of the chip (20) and of the target (50) in an opposite second, translational direction.

* * * * *

UNITED STATES PATENT AND TRADEMARK OFFICE
CERTIFICATE OF CORRECTION

PATENT NO.       : 8,624,586 B2                                           Page 1 of 1
APPLICATION NO. : 13/122278
DATED            : January 7, 2014
INVENTOR(S)      : Dordet et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 291 days.

Signed and Sealed this

Twenty-second Day of September, 2015

Michelle K. Lee
*Director of the United States Patent and Trademark Office*